(12) United States Patent
Leivers et al.

(10) Patent No.: US 10,840,625 B2
(45) Date of Patent: Nov. 17, 2020

(54) POWER MANAGEMENT PANEL AND CONTROLLER ASSEMBLY

(71) Applicant: GE Aviation Systems Limited, Cheltenham (GB)

(72) Inventors: Christopher Andrew Leivers, Stroud (GB); John Michael Brett, Tewkesbury (GB)

(73) Assignee: GE Aviation Systems Limited, Cheltenham (GB)

( * ) Notice: Subject to any disclaimer, the term of this patent is extended or adjusted under 35 U.S.C. 154(b) by 116 days.

(21) Appl. No.: 15/986,873

(22) Filed: May 23, 2018

(65) Prior Publication Data

US 2018/0342826 A1 Nov. 29, 2018

(30) Foreign Application Priority Data

May 23, 2017 (GB) .................................. 1708219.9

(51) Int. Cl.

| H05K 1/00 | (2006.01) |
|---|---|
| H01R 12/91 | (2011.01) |
| H01R 13/73 | (2006.01) |
| H01R 12/71 | (2011.01) |
| B64D 47/00 | (2006.01) |
| H05K 5/00 | (2006.01) |
| H02B 1/32 | (2006.01) |
| H05K 7/14 | (2006.01) |

(52) U.S. Cl.
CPC ............ *H01R 12/91* (2013.01); *B64D 47/00* (2013.01); *H01R 12/716* (2013.01); *H01R 13/73* (2013.01); *H02B 1/32* (2013.01); *H05K 5/0008* (2013.01); *H05K 5/0069* (2013.01); *H05K 7/1412* (2013.01); *B64D 2221/00* (2013.01); *H01R 2201/26* (2013.01)

(58) Field of Classification Search
USPC ......................................................... 361/748
See application file for complete search history.

(56) References Cited

U.S. PATENT DOCUMENTS

| 4,498,119 | A * | 2/1985 | Cronin ................. H05K 7/1404 361/721 |
|---|---|---|---|
| 4,808,115 | A | 2/1989 | Norton et al. |
| 6,580,041 | B1 | 6/2003 | Ransopher |
| 8,559,149 | B2 | 10/2013 | Wavering et al. |
| 8,749,956 | B2 | 6/2014 | Guering |
| 8,753,129 | B2 | 6/2014 | Worley |
| 2002/0081881 | A1 | 6/2002 | Komenda et al. |

(Continued)

FOREIGN PATENT DOCUMENTS

CN 102427188 B 10/2015

OTHER PUBLICATIONS

Chinese Office Action issued in related Chinese Patent Application No. 201810526586.3, dated Aug. 7, 2019.

*Primary Examiner* — Andargie M Aychillhum
(74) *Attorney, Agent, or Firm* — McGarry Bair PC

(57) ABSTRACT

An avionics power management panel and power panel controller assembly where the panel includes a cabinet including a set of walls at least partially defining an interior with a printed circuit board. The power panel controller assembly can be provided in the interior and can include a chassis housing one or more power panel control modules adapted to couple to the printed circuit board via one or more complementary PCB connectors.

18 Claims, 8 Drawing Sheets

(56) References Cited

U.S. PATENT DOCUMENTS

| | | | |
|---|---|---|---|
| 2005/0044878 A1* | 3/2005 | Winders | F25D 23/04 |
| | | | 62/440 |
| 2008/0013261 A1 | 1/2008 | Luettermann et al. | |
| 2015/0016942 A1* | 1/2015 | Bahlatzis | B66C 1/10 |
| | | | 414/816 |
| 2015/0124377 A1 | 5/2015 | Weiss et al. | |

* cited by examiner

POWER MANAGEMENT PANEL AND CONTROLLER ASSEMBLY

BACKGROUND OF THE INVENTION

Contemporary aircraft use avionics in order to control the various equipment and operations for flying the aircraft. The avionics can include electronic components carried by a circuit board or connected to circuit breakers. An electrical distribution system for the aircraft includes power management panels that can be used to route power from electrical generators to various electrical loads. Such power management panels can be relatively large, and can include assemblies charged with critical aspects in performance of the electrical system, often within a demanding environment.

BRIEF DESCRIPTION OF THE INVENTION

In one aspect, the present disclosure relates to a power management panel including an avionics power management cabinet including a set of walls at least partially defining a cabinet interior with an open face. A printed circuit board operably couples with the cabinet interior and includes a set of PCB connectors. A power panel controller assembly includes a chassis having a set of spaced walls and a cover at least partially defining a chassis interior and a set of power panel control modules selectively receivable within the chassis interior. A power panel control module includes at least one printed circuit board and a high density connector configured to mate with one of the set of PCB connectors and where the set of power panel control modules float in at least one axis.

In another aspect, the present disclosure relates to a power panel controller assembly including a chassis including a set of spaced walls and a cover at least partially defining a chassis interior. A set of power panel control modules selectively receivable within the chassis interior where a power panel control module includes at least one printed circuit board and a high density connector configured to mate with a PCB connector of a PCB. The set of power panel control modules float in at least one axis and wherein the power panel controller assembly is configured for an avionics power management panel.

In yet another aspect, the present disclosure relates to an electronic unit including a chassis including a set of spaced walls and a cover at least partially defining a chassis interior. A set of power panel control modules are selectively receivable within the chassis interior and where a power panel control module includes at least one printed circuit board and a high density connector. At least one pair of sprung card guides are configured to moveably retain a power panel control module and are on two opposite walls of the set of spaced walls. At least one bracket operably couples to a power panel control module and includes a protrusion that extends through an opening in the chassis. A fastener is configured to tighten against a portion of the protrusion and provide a clearance within the chassis. A width of the two opposite walls of the set of spaced walls is dimensioned to provide a clearance about the power panel control module.

DETAILED DESCRIPTION

Figure 1:
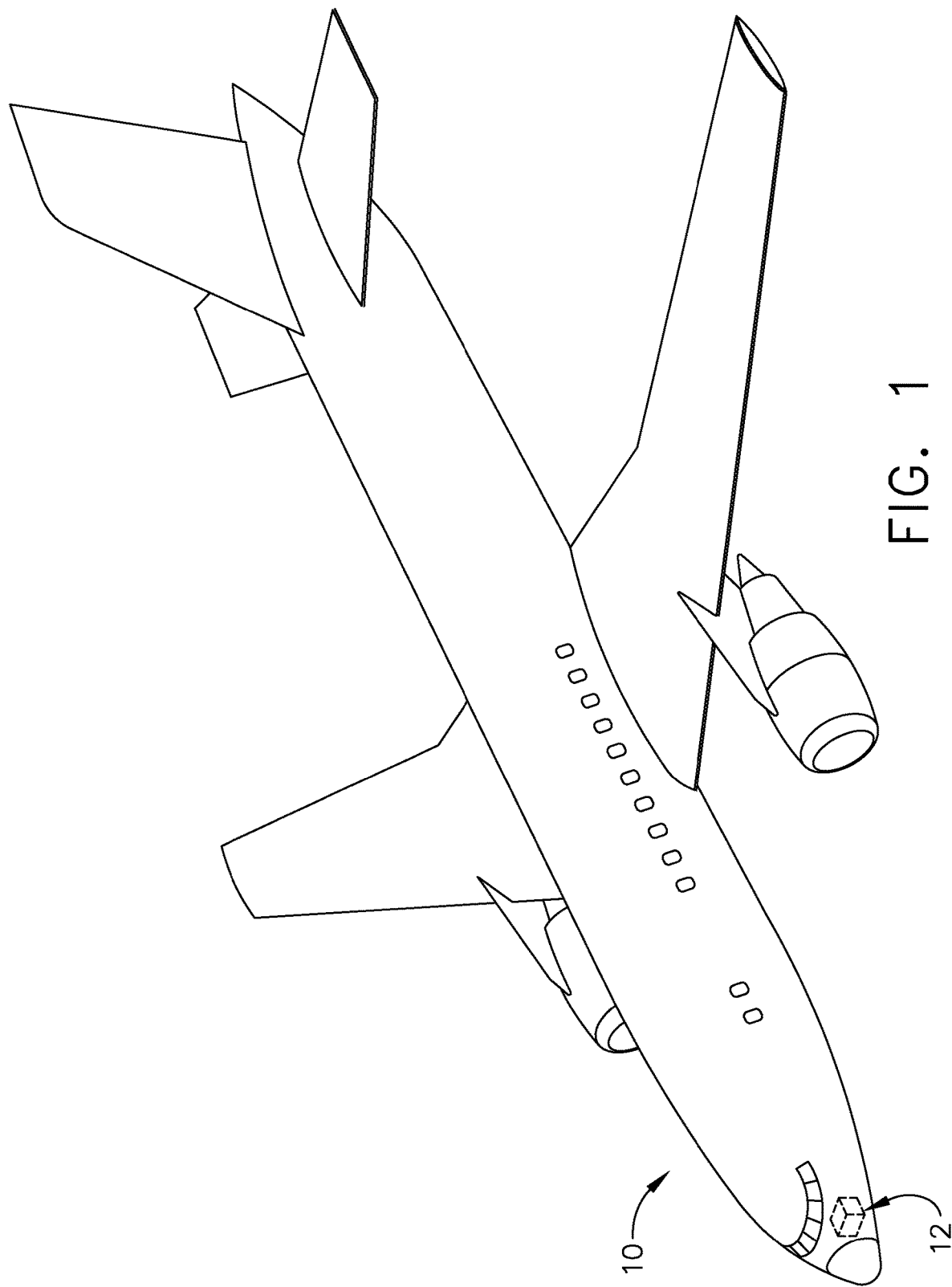
FIG. 1 is a perspective view of an aircraft having an avionics chassis in accordance with various aspects described herein.

On aircraft the electrical power distribution system services various loads around the aircraft. Power management panels are used to route power from the electrical power source to the electrical loads. On modern aircraft the increased number of services demands an increase in the number of components and circuits. The increase in required components and circuits leads to increased wiring for the specific loads, often requiring complex wiring looms which increase complexity and overall weight. Power panel components are often fixed to the power management panels in complex regions, providing challenges for removal of such components, or even causing damage to the complex electrical components during removal, replacement, or maintenance. Aspects of the disclosure describe a beneficial power panel component assembly.

While "a set of" various elements will be described, it will be understood that "a set" can include any number of the respective elements, including only one element. Additionally, all directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order, and relative sizes reflected in the drawings attached hereto can vary. "Float" as used herein means that an element is not fixed, and has room for slight movement in one or more directions, while being limited from excessive movement from an initial position. For example, an element may be able to float 1/100th of an inch in a direction, until limited by another fixed element.

FIG. 1 schematically illustrates an aircraft 10 with an on-board avionics chassis assembly 12 (shown in dashed line), which can include a power management panel. The avionics chassis assembly 12 can house a variety of avionics elements and protect them against contaminants, vibrations, and the like and aids in dissipating the heat generated by the avionics or electronic components. It will be understood that the avionics chassis assembly 12 can be located anywhere within the aircraft 10, not just the nose as illustrated. For example, there can be any number of power management panels distributing power around the aircraft 10. While illustrated in a commercial airliner, the avionics chassis assembly 12 can be used in any type of aircraft, for example, without limitation, fixed-wing, rotating-wing, rocket, commercial aircraft, personal aircraft, and military aircraft. Furthermore, aspects of the disclosure are not limited only to aircraft aspects, and can be included in other mobile and stationary configurations. Non-limiting example mobile configurations can include ground-based, water-based, or additional air-based vehicles. Any implementation has its own space constraints and power requirements. As such, the design of the particular aspects of the avionics chassis assembly 12 as described herein can be tailored to suit specific installation requirements of the implementation.

Figure 2:
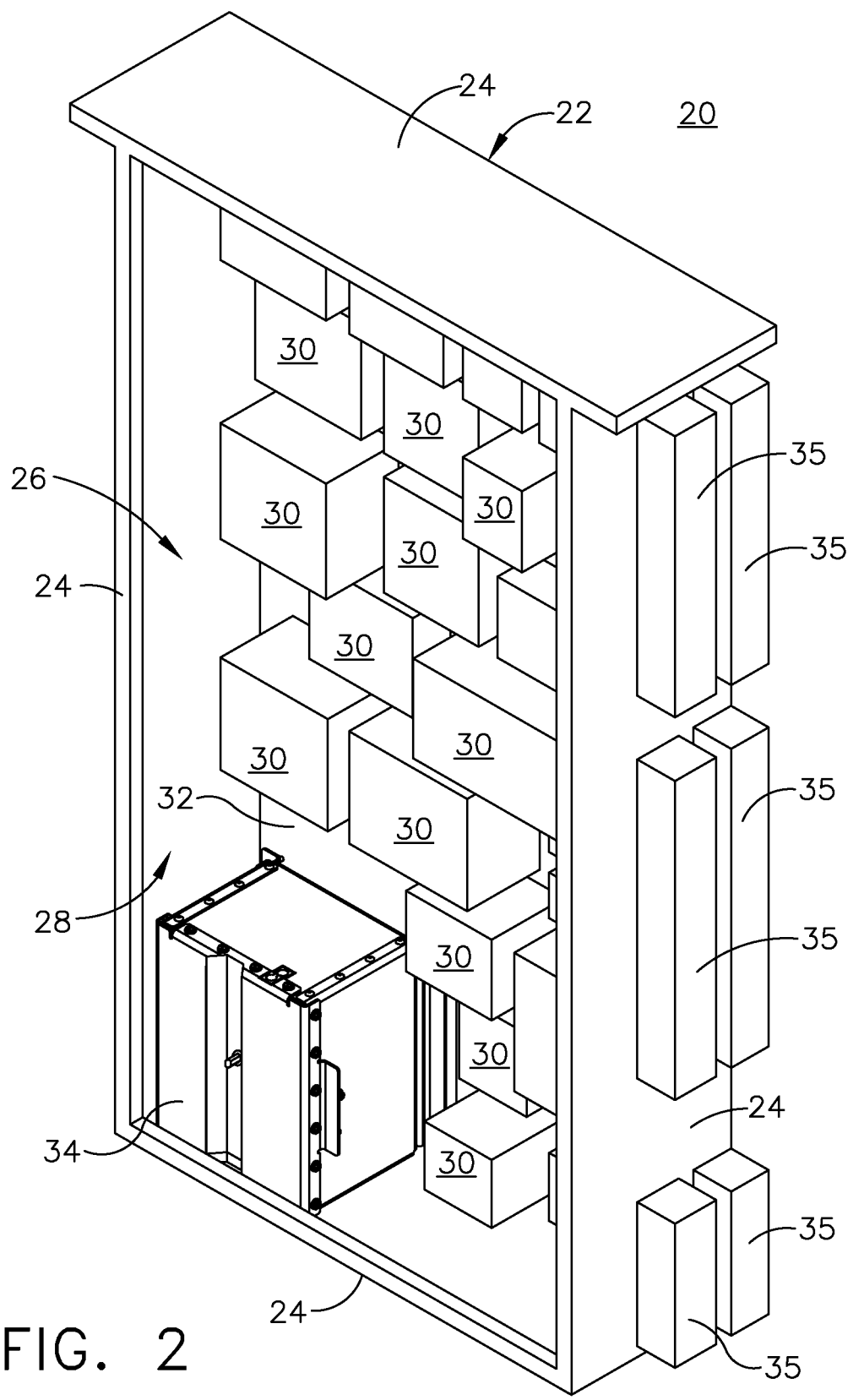
FIG. 2 is a perspective view of a power management panel having a power panel controller assembly for use in the avionics chassis of FIG. 1 in accordance with various aspects described herein.

Referring now to FIG. 2, an exemplary power management panel 20 includes a power management cabinet 22 having a set of walls 24, such as sidewalls, that at least partially define a cabinet interior 26 having an open face 28. It should be appreciated that a cover (not shown), such as a heat shield, or an additional wall can be removably mountable at the open face 28 to enclose the cabinet interior 26. Alternatively, a door can be moveably mounted to the power management cabinet 22 and be positioned in a closed position wherein the cabinet interior 26 is inaccessible and an opened position wherein a user can access the cabinet interior 26.

A set of electrical components 30 can be provided in the cabinet interior 26. The set of electrical components 30 can mount to one or more printed circuit boards (PCB) 32 that operably couple within the cabinet interior 26. A set of exterior connectors 35 can be provided on the exterior of the set of walls 24 and communicatively coupled to one or more of the electrical components 30.

Figure 3:
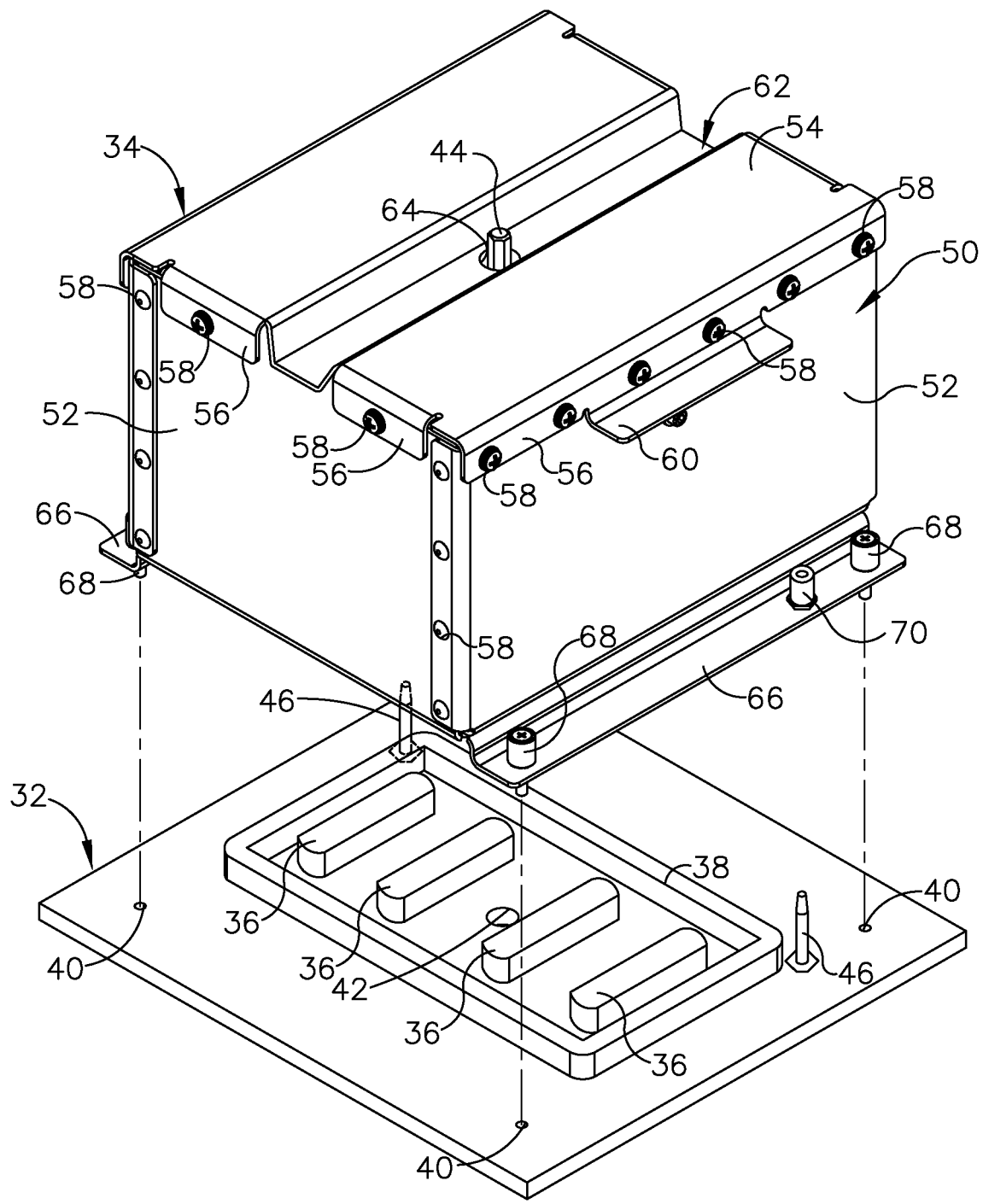
FIG. 3 is an exploded view of the power panel controller assembly of FIG. 2 exploded from a printed circuit board including a set of PCB connectors of the power management panel in accordance with various aspects described herein.

One exemplary electrical component 30 can be an electronic unit in the form of a power panel controller assembly 34. Referring to FIG. 3, the power panel controller assembly 34 is exploded from an exemplary PCB 32. A set of PCB connectors 36 are provided on the PCB 32, illustrated as four schematic, exemplary PCB connectors 36. The set of PCB connectors 36 can be pinned connectors, such as a D-type PCB connector in one non-limiting example. The set of PCB connectors 36 can electrically and communicatively couple the power panel controller assembly 34 to the PCB 32. A gasket 38 can be provided around the set of PCB connectors 36. The gasket 38 can be an electromagnetic compatibility gasket, in one non-limiting example, minimizing radio frequency interference at the set of PCB connectors 36. A set of apertures 40 can be provided in the PCB 32 for mechanically mounting the power panel controller assembly 34 to the PCB 32. A central aperture 42 can be provided in the PCB 32 between the set of PCB connectors 36. As illustrated a central jacking screw 44 can extend through the power panel controller assembly 34 and through the central aperture 42 to further secure the power panel controller assembly 34 to the PCB 32. A set of location pins 46 can mount the power panel controller assembly 34 to the PCB 32 and are adapted to provide initial alignment the power panel controller assembly 34 when mounting it to the PCB 32.

The power panel controller assembly 34 includes a chassis 50 having a set of walls 52. A cover 54 can be fastened to the set of walls 52 to enclose a chassis interior 80 (FIG. 4) of the power panel controller assembly 34. While illustrated as solid elements, the cover 54 or the walls 52 can include perforations permitting venting of air through the power panel controller assembly 34. The cover 54 can have a peripheral skirt 56 adapted to overlap at least a portion of one or more of the walls 52. Fasteners 58 can be used to mount the cover 54 to the set of spaced walls 52 along the skirt 56, as well as mounting adjacent walls 52. A first flange 60 can extend from the peripheral skirt 56. A channel 62 can be shaped in the cover 54 having an aperture 64 provided along the channel 62. The aperture 64 can be adapted to align with the central aperture 42 in the PCB 32, adapted to receive the central jacking screw 44. A second flange 66 can extend from one or more of the walls 52 opposite of the cover 54. One or more fasteners 68 can extend through the second flange 66, adapted to mount the chassis 50 to the PCB 32 at the apertures 40. The fasteners 68, in one non-limiting example, can be spring loaded captive screws, or any other suitable screws to mount the chassis to the PCB 32. Similarly, bushings 70 can be provided on the second flange 66, corresponding to and adapted to receive the locating pins 46 to align the chassis 50 when coupling the power panel controller assembly 34 to the PCB 32.

Figure 4:
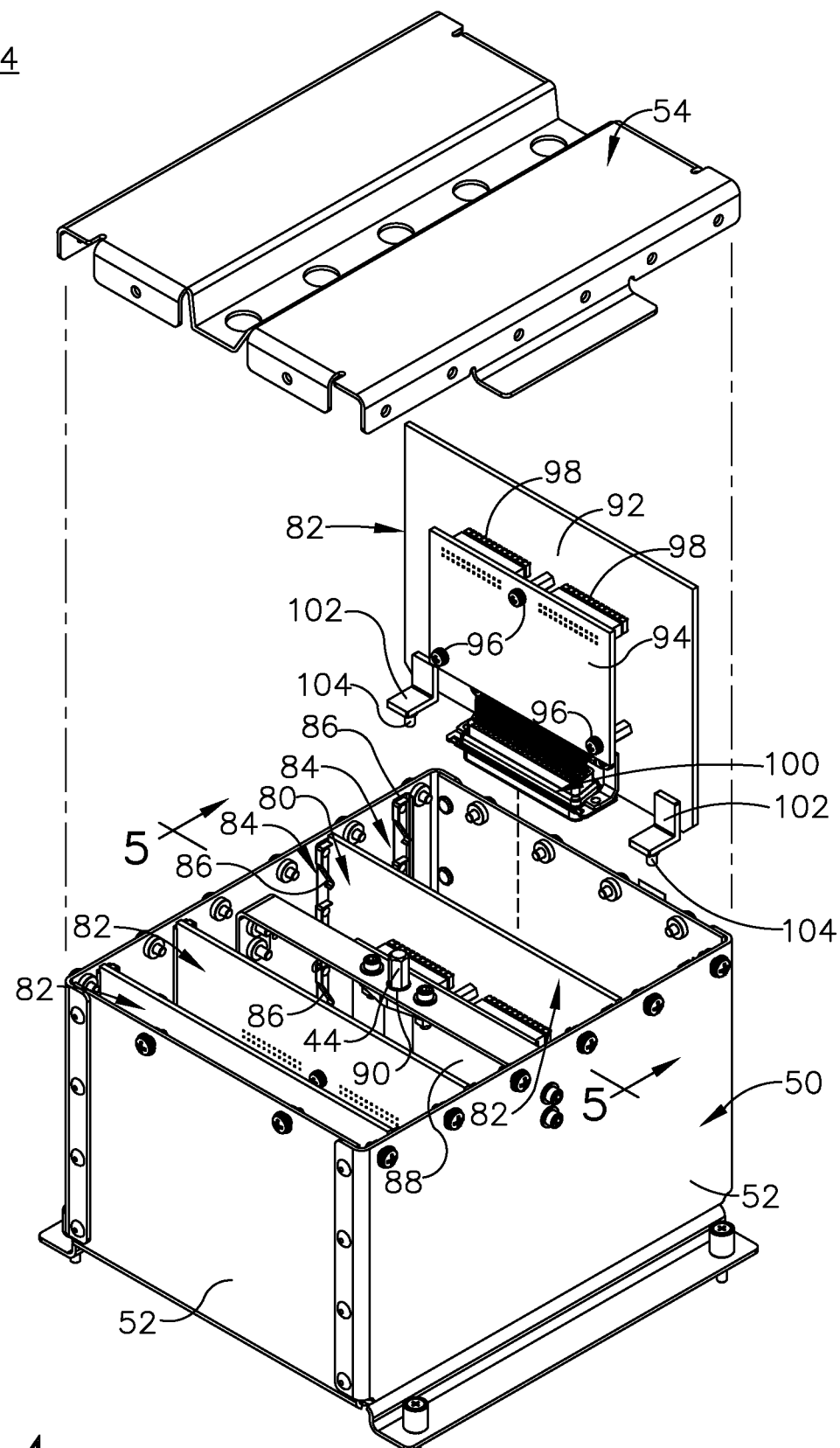
FIG. 4 is a partially exploded view of the power panel controller assembly of FIG. 3 illustrating a set of power panel control modules within the chassis in accordance with various aspects described herein.

Referring now to FIG. 4, the cover 54 has been exploded from the rest of the chassis 50, exposing a chassis interior 80 for the power panel controller assembly 34 at least partially defined by the walls 52 and the cover 54. A set of power panel control modules 82 are provided in the chassis interior 80, having one exemplary power panel control module 82 exploded from the chassis 50 to better illustrate the components included on the power panel control module 82. While illustrated as having four power panel control modules 82, any number of power panel control modules 82 are contemplated. As such, the chassis 50 can be sized to accommodate the number of power panel control modules 82, and the set of PCB connectors 36 of FIG. 3 can be complementary to the number of power panel control modules 82.

The set of power panel control modules 82 can be selectively receivable in the chassis interior 80. At least one pair of sprung card guides 84 can be mounted along the walls 52 within the chassis interior 80 configured to removably retain a power panel control module 82. In the illustrated example, four pair of sprung card guides 84 are included as a complementary number to the four power panel control modules 82. The pair of sprung card guides 84 can include two sprung card guides 84 positioned on two opposite walls 52, providing for sliding insertion or removal of the power panel control module 82. One or more spring fingers 86 can be provided at the sprung card guides 84 adapted to flexibly retain the inserted power panel control module 82.

The set of power panel control modules 82 can include at least one printed circuit board, illustrated as an exemplary primary panel PCB 92 and an exemplary secondary panel PCB 94 mounted to the primary panel PCB 92 via one or more fasteners 96. A pin set 98, in one example, can communicatively couple the primary panel PCB 92 to the secondary panel PCB 94. A high density connector 100 can couple to the primary panel PCB 92 adapted to electrically and communicatively couple the power panel control module 82 to the PCB 32 of FIG. 3 and configured to mate with one of the PCB connectors 36. Two brackets 102 are coupled to the power panel control module 82 at the primary panel PCB 92 and spaced from the high density connector 100. A protrusion 104 extends from each bracket 102.

A strut 88 can be provided in the interior 80, extending between two opposite walls 52, and can be aligned parallel to the inserted power panel control modules 82. A strut aperture 90 can be provided in the strut 88 adapted to receive and align the central jacking screw 44 extending through the chassis interior 80.

Figure 5:
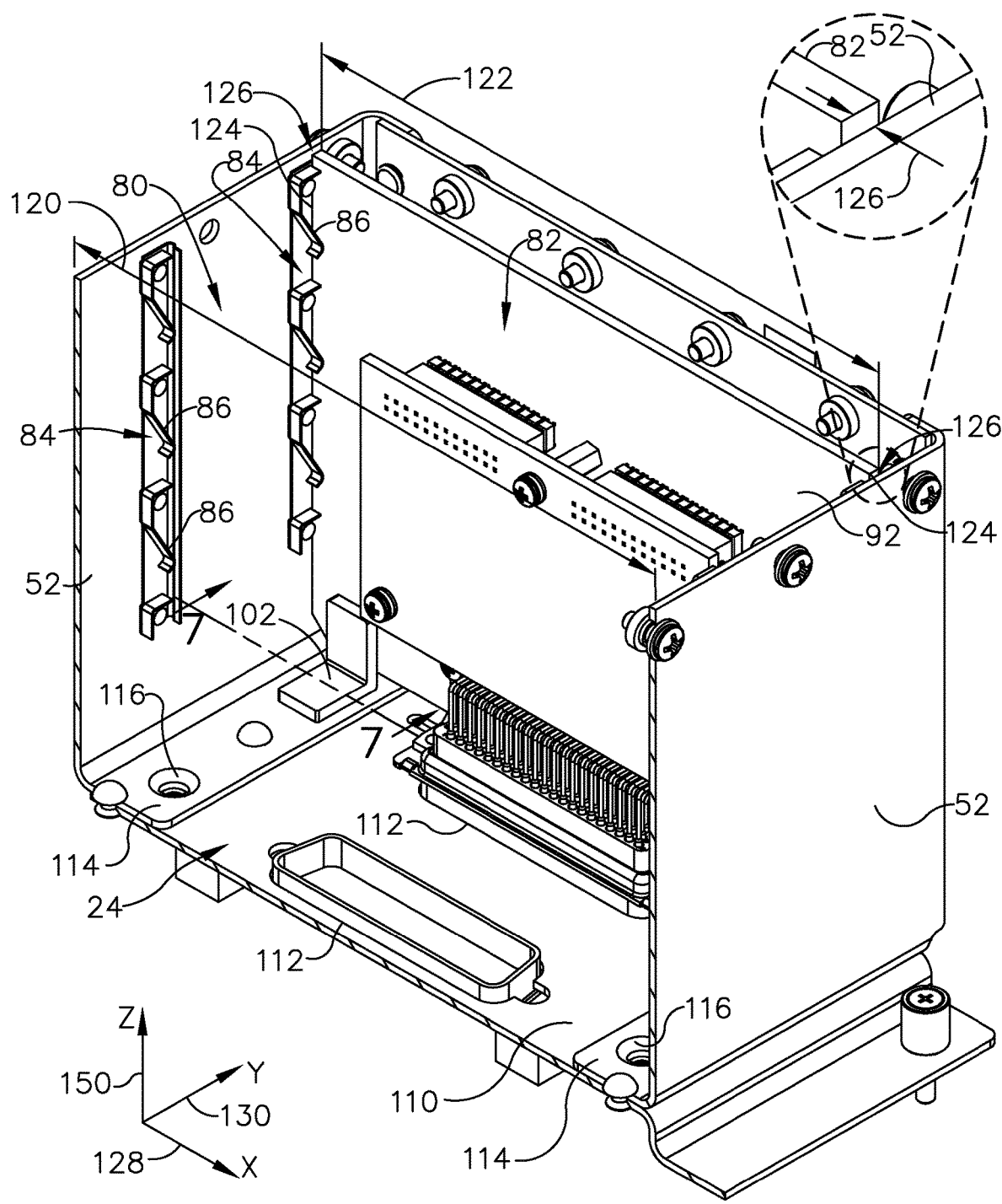
FIG. 5 is a section view of the power panel controller assembly of FIG. 4 taken across section 5-5 illustrating one power panel control module mounted to the chassis at a sprung card guide in accordance with various aspects described herein.

Referring now to FIG. 5, the set of walls 52 can further include a bottom wall 110. A set of PCB connector apertures 112 can be formed in the bottom wall 110 adapted to receive the high density connector 100 to couple to the set of PCB connectors 36 of FIG. 3. A third flange 114 can extend from the walls 52 to the chassis interior 80, overlying a portion of the bottom wall 110. An opening 116 can extend through the third flange 114 and the bottom wall 110. The opening 116 can be adapted to receive the brackets 102 in mounting the power panel control modules 82 to the chassis 50.

A width 120 for the power panel control assembly 34 can be defined between the walls 52 having the sprung card guides 84. A longitudinal length 122 can be defined as the length of the power panel control module 82 between ends 124 of the power panel control module 82, defined parallel to the width 120. The width 120 can be greater than the longitudinal length 122 for the primary panel PCB 92. A gap 126 can be defined between each end 124 of the primary panel PCB 92 and the walls 52. As such, the width of the two opposite walls 52 can be dimensioned to provide a clearance about the power panel control module 82 at the gaps 126.

An X-axis 128 can be defined in a direction along the longitudinal length 122 of the primary panel PCB 92. A Y-axis 130 can be defined along a direction perpendicular to the X-axis 128, and parallel to the walls 52 to which the sprung card guides 84 mount. A Z-axis 150 can be defined perpendicular to both the X-axis 128 and the Y-axis 130, extending in a vertical direction perpendicular to the bottom wall 110. The gaps 126 can permit movement for the power panel control module 82 along the X-axis 128 defined in a direction parallel to the longitudinal length 122 of the primary panel PCB 92. Therefore, the gaps 126 permit the power panel control module 34 to float along the X-axis 128. While the power panel control module 82 is illustrated as spaced from both walls 52, it should be understood that the power panel control modules 82 can contact the walls 52 while floating, such as during installation.

Similarly, the spring fingers 86 of the sprung card guides 84 permit movement for the power panel control module along the Y-axis 130, defined in a direction orthogonal to the X-axis 128 and parallel to the bottom wall 110. The spring fingers 86 are flexible, permitting the power panel control module 34 to float along the Y-axis 130. While the assembly as described can float in the X-axis 128 and the Y-axis, 130, it should be understood that the power panel control modules 82 can float in at least one axis, as well as two or three axes.

Figure 6:
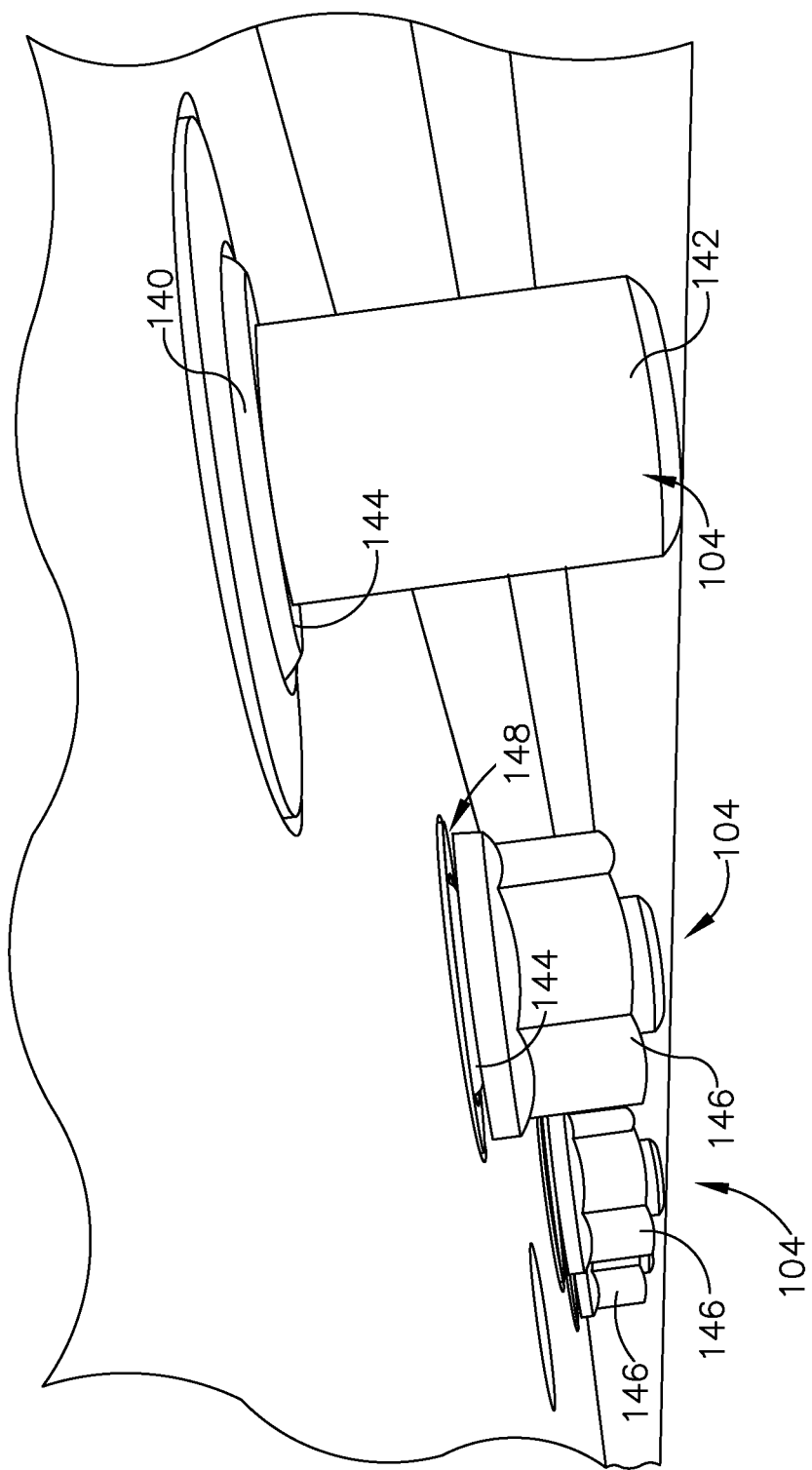
FIG. 6 is a bottom view of the power panel controller assembly of FIG. 3 illustrating a protrusion of a bracket extending underneath a bottom wall of the power panel controller assembly in accordance with various aspects described herein.

Referring now to FIG. 6, the protrusions 104 of the brackets 102 are shown extending through the bottom wall 110. Complementary nuts 146 can secure to the protrusions 104, such as with a threaded connection, for example. The protrusions 104 can include a first portion 140 and a second portion 142. The first portion 140 can have a larger diameter than the second portion 142 to define a shoulder 144 at the junction between the first portion 140 and the second portion 142. The first portion 140 can extend through the opening 116 in the bottom wall 110, and can be sized such that the first portion 140 extends through the opening 116 to position the shoulder 144 beneath the bottom wall 110. When fastening the nut 146 to the second portion 142, the nut 146 can abut the shoulder 144 to define a gap 148 between the nut 146 and the bottom wall 110. It should be understood that while one protrusion 104 is shown without a nut 146, it is shown as such for illustrative purposes only to better illustrate the shoulder 144 formed between the first portion 140 and the second portion 142, and that a nut 146 can be fastened to all protrusions 104.

Figure 7:
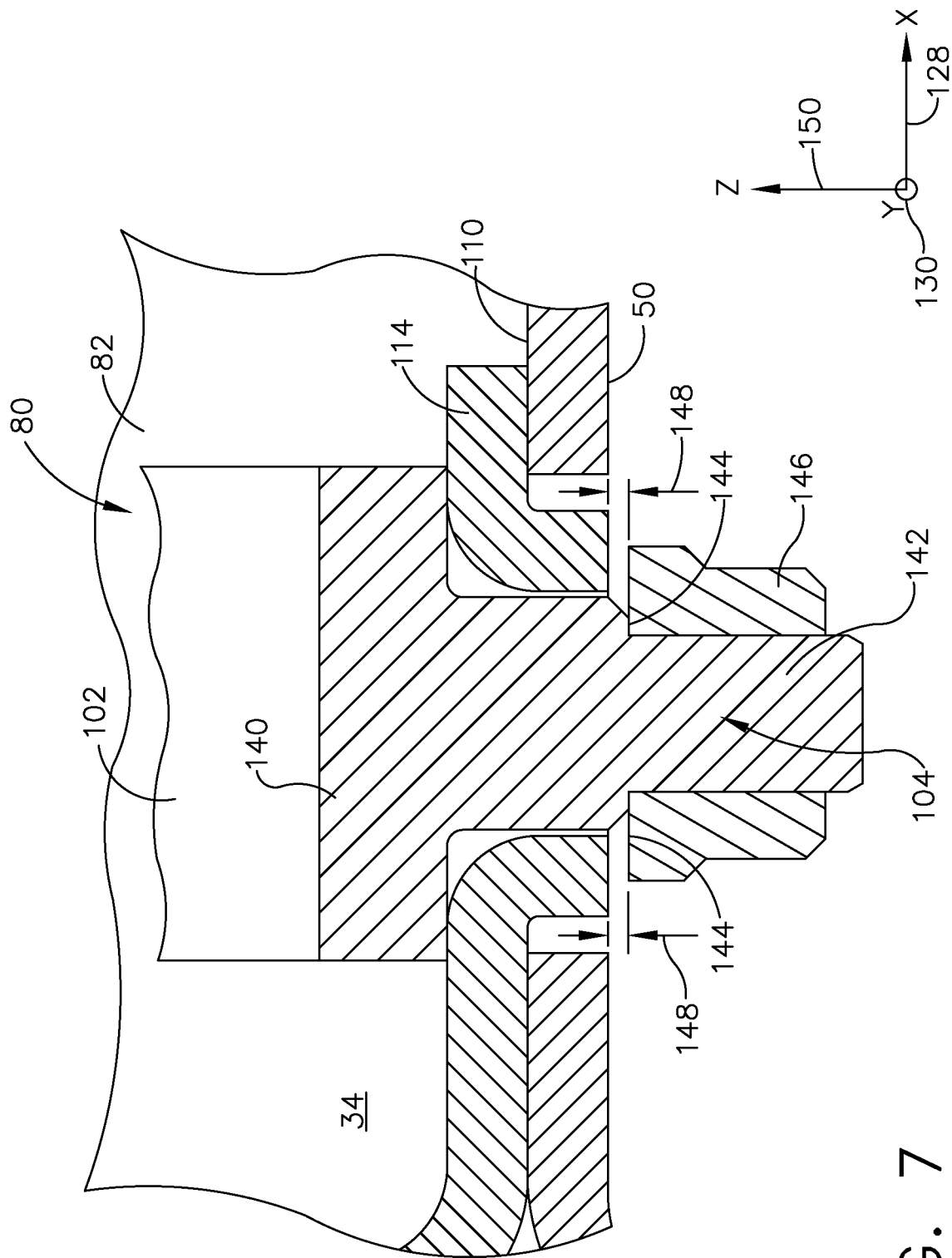
FIG. 7 is a section view taken along section 7-7 of FIG. 5 illustrating a bracket for mounting the power panel control module to the power panel controller assembly in accordance with various aspects described herein.

Referring now to FIG. 7, a sectional view, taken along section 7-7 of FIG. 5, better illustrates the protrusion 104 of the bracket 102 extending through the third flange 114 or the bottom wall 110. The nut 146 tightens against the shoulder 144 of the protrusion 104 and spaces the nut 146 from the chassis 50 at the bottom wall 110. The gap 148 permits movement of the power panel control module 82 along a Z-axis 150, defined longitudinally through the protrusion 104, and orthogonal to both the X-axis and Y-axis 128, 130. It should be noted that the Y-axis 130 extends into the page as shown in FIG. 7. During such movement, the bracket 102 can lift away from the chassis 50, along the Z-axis 150, until the nut 146 contacts the chassis 50 at the bottom wall 110 limiting movement of the power panel control module 82 about the Z-axis 150, permitting floating of the power panel control module 82 about the Z-axis 150. The positioning can be substantially orthogonal, varying from orthogonal during floating of the power panel control module 82 about one or more of the axes 128, 130, 150.

As such, the power panel control modules 82 are permitted to float along three axes 128, 130, 150, while it is contemplated that the power panel control modules 82 can float along at least one axis, which can be any one of the X-axis 128, the Y-axis 130, or the Z-axis 150, as well as two or three axes. Such floating, in one non-limiting example, can be ten thousandths of an inch or about 25.40 micrometers (μm). Floating movement of the power panel control modules 82 facilitates repeatable connection and disconnection of the power panel controller assembly 34 within a crowded space across all power panel control modules 82 contained within the power panel controller assembly 34. During installation, the floating movement of the power panel control modules 82 enables ease of connection or disconnection of the high density connector 100 to the set of PCB connectors 36, providing for slight variation in movement to prevent rigid connection, which can damage components.

Figure 8:
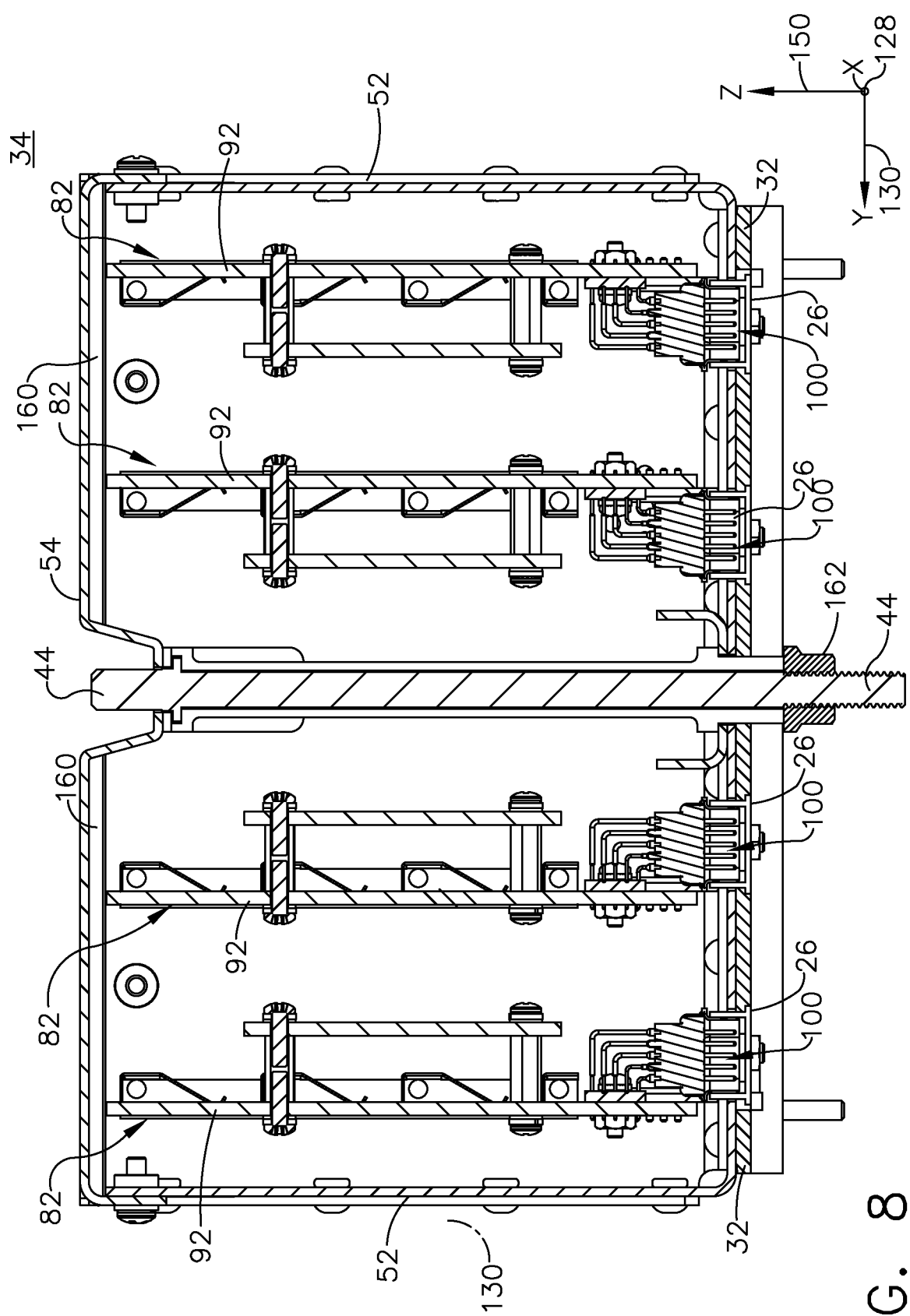
FIG. 8 is a section view of the power panel controller assembly illustrating a gaskets provided between a cover and the power panel control modules in accordance with various aspects described herein.

Referring now to FIG. 8, after floating movement of the power panel control modules 82 facilitates connection of the high density connectors 100 to the set of PCB connectors 36 on the PCB 32, the central jacking screw 44 can extend below the PCB 32 and can threadably fasten to a fastener 162 such as a compliant nut or a mating female threaded nut, to secure the power panel controller assembly 34 at the PCB 32. Optionally, in high vibration environments, a gasket 160 can be provided between the cover 54 and the primary panel PCB 92, to minimize vibrational movement of the power panel control modules 82 permitted by the ability to float about the three axes 128, 130, 150, with the first axis 128 extending into and out of the page as illustrated. The gasket 160 can be a compliant gasket 160 mounted to the underside of the cover 54, abutting the power panel control modules 82 at coupling the cover 54 to the walls 52. The gasket 160 can be made of a material that dampens vibrations, such as a polymeric material in one non-limiting example. The gasket 160 minimizes unwanted vibrational movement of the power panel control modules 82 after installation, while permitting floating movement during installation or removal of the power panel controller assembly 34.

The power panel controller assembly 34 as described herein incorporates a retention mechanism within the power panel controller assembly 34 that utilizes packing volume and provides a means of using several high density connectors 100 permitting increased functionality. Additionally, permitting the use of multiple high density connectors 100 mounting directly to connectors 36 at the PCB 32 provides for minimizing or eliminating the need for complex wiring looms that distributes control signals to and from the power panel control module. Elimination of such wiring looms minimizes overall system cost, weight, and complexity. Furthermore, the high density connectors 100 provides for increased functionality, necessary to accommodate the increasing demands for such power panel controller assemblies 34.

The ability of the mounting and retention system to float in three axes 128, 130, 150 permits the power panel control modules 82, and thus the power panel controller assembly 34, to be easily and readily connected and disconnected from the PCB 32 repeatedly, minimizing the potential for damage to the pinned connections and facilitating maintenance.

It should be appreciated that while the connection configuration as described herein is described in relation to a power panel controller assembly provided in an avionics chassis for an aircraft, the floating connection configuration can be transferrable or transportable to power panel controller assemblies or printed circuit boards utilizing multiple high density connectors incorporating a blind mate capability.

To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A power management panel, comprising:
    a power management cabinet comprising a set of walls at least partially defining a cabinet interior;
    a printed circuit board provided within the cabinet interior and having a set of PCB connectors; and
    a power panel controller assembly, comprising:
        a chassis including a set of spaced walls and a cover at least partially defining a chassis interior, and a pair of sprung card guides disposed on respective opposing walls of the set of spaced walls; and
        a set of power panel control modules selectively receivable within the chassis interior by the pair of sprung card guides, and where a power panel control module includes at least one panel printed circuit board and a high density connector configured to mate with one of the set of PCB connectors and where the set of power panel control modules float in at least one axis.

2. The power management panel of claim 1, wherein the set of PCB connectors includes four PCB connectors and the set of power panel control modules includes four power panel control modules.

3. The power management panel of either of claim 1, wherein the chassis of the power panel controller assembly is mounted to the printed circuit board via a set of spring loaded captive screws.

4. The power management panel of claim 1, further comprising a set of location pins on the printed circuit board and corresponding bushings on the chassis of the power panel controller assembly.

5. The power management panel of claim 1, further comprising a central jacking screw on the chassis of the power panel controller assembly and a mating fastener on the printed circuit board.

6. The power management panel of claim 1, wherein a width of the two opposite walls of the set of spaced walls is dimensioned to provide clearance about the power panel control module.

7. The power management panel of claim 1, further comprising at least one bracket operably coupled to the set of power panel control modules and where the at least one bracket includes a protrusion that extends through an opening in the chassis.

8. The power management panel of claim 7, further comprising a fastener configured to tighten against a portion of the protrusion and provide a clearance with the chassis.

9. The power management panel of claim 1, wherein the set of power panel control modules float in at least two axes.

10. The power management panel of claim 9, wherein the set of power panel control modules float in three axes.

11. The power management panel of claim 1, further comprising a gasket located between the cover and the set of power panel control modules.

12. A power panel controller assembly for an avionics power management panel, the power panel controller assembly comprising:
    a chassis including a set of spaced walls and a pair of sprung card guides disposed on respective opposing walls of the set of spaced walls, and a cover at least partially defining a chassis interior; and
    a set of power panel control modules selectively receivable by the pair of sprung card guides, within the chassis interior and where at least one power panel control module of the set of power panel control modules includes at least one panel printed circuit board and a high density connector configured to mate with a PCB connector of a printed circuit board and where the set of power panel control modules float in at least one axis.

13. The power panel controller assembly of claim 12, wherein a width of the two opposite walls of the set of spaced walls is dimensioned to provide clearance about the power panel control module.

14. The power panel controller assembly of any of claim 12, further comprising at least one bracket operably coupled to the set of power panel control modules and where the at least one bracket includes a protrusion that extends through an opening in the chassis.

15. The power panel controller assembly of claim 14, further comprising a fastener configured to tighten against a portion of the protrusion and provide a clearance with the chassis.

16. The power panel controller assembly of claim 12, wherein the set of power panel control modules float in three axes.

17. An electronic unit, comprising:
- a chassis including a set of spaced walls and a pair of sprung card guides disposed on respective opposing walls of the set of spaced walls, and a cover at least partially defining a chassis interior; and
- a set of power panel control modules selectively receivable by the pair of sprung card guides, within the chassis interior, the sprung card guides configured to moveably retain a power panel control module and where the set of power panel control modules includes at least one panel printed circuit board and a high density connector;
- at least one bracket operably coupled to the set of power panel control modules and where the at least one bracket includes a protrusion that extends through an opening in the chassis; and
- a fastener configured to tighten against a portion of the protrusion and provide a clearance with the chassis;
- wherein a width of the opposing walls of the set of spaced walls is dimensioned to provide clearance about the power panel control module.

18. The electronic unit of claim 17, wherein the protrusion includes a male thread having a shoulder that extends below the chassis and the fastener includes a nut configured to tighten to the shoulder.

* * * * *